United States Patent
Ozaki et al.

(10) Patent No.: US 10,224,259 B2
(45) Date of Patent: Mar. 5, 2019

(54) RESIN COMPOSITION FOR SEALING SEMICONDUCTOR AND SEMICONDUCTOR DEVICE

(71) Applicant: SUMITOMO BAKELITE CO., LTD., Shinagawa-ku (JP)

(72) Inventors: Yui Ozaki, Tokyo (JP); Katsushi Yamashita, Tokyo (JP); Tomomasa Kashino, Tokyo (JP)

(73) Assignee: SUMITOMO BAKELITE CO., LTD., Shinagawa-ku (JP)

( * ) Notice: Subject to any disclaimer, the term of this patent is extended or adjusted under 35 U.S.C. 154(b) by 56 days.

(21) Appl. No.: 14/898,966

(22) PCT Filed: Jun. 11, 2014

(86) PCT No.: PCT/JP2014/065461
§ 371 (c)(1),
(2) Date: Dec. 16, 2015

(87) PCT Pub. No.: WO2014/203781
PCT Pub. Date: Dec. 24, 2014

(65) Prior Publication Data
US 2016/0372394 A1     Dec. 22, 2016

(30) Foreign Application Priority Data
Jun. 21, 2013    (JP) .................................. 2013-131198

(51) Int. Cl.
*C08K 3/36*    (2006.01)
*H01L 23/29*    (2006.01)
(Continued)

(52) U.S. Cl.
CPC ........ *H01L 23/295* (2013.01); *C08G 73/0233* (2013.01); *C08G 73/12* (2013.01); *C08K 3/36* (2013.01); *C08K 5/3445* (2013.01); *C08K 5/357* (2013.01); *C08K 5/378* (2013.01); *C08K 5/548* (2013.01); *H01L 21/56* (2013.01); *H01L 23/49513* (2013.01); *H01L 29/1608* (2013.01); *H01L 29/2003* (2013.01); *C08K 5/35* (2013.01); *H01L 23/3107* (2013.01); *H01L 2224/2919* (2013.01); *H01L 2224/32245* (2013.01); *H01L 2224/45124* (2013.01); *H01L 2224/45144* (2013.01); *H01L 2224/48091* (2013.01); *H01L 2224/48247* (2013.01); *H01L 2224/73265* (2013.01); *H01L 2924/1033* (2013.01); *H01L 2924/10272* (2013.01); *H01L 2924/181* (2013.01)

(58) Field of Classification Search
CPC ..................................................... C08K 5/35
See application file for complete search history.

(56) References Cited

U.S. PATENT DOCUMENTS

2012/0319280 A1*    12/2012    Suganuma ........... B23K 35/282
257/751

FOREIGN PATENT DOCUMENTS

CN    1871276 A    11/2006
JP    10 259248    9/1998
(Continued)

OTHER PUBLICATIONS

Takeichi et al., "High-performance polymer alloys of polybenzoxazine and bismaleimide," Polymer, vol. 49, (2008), pp. 1173-1179.
(Continued)

*Primary Examiner* — Michael F Pepitone
(74) *Attorney, Agent, or Firm* — Oblon, McClelland, Maier & Neustadt, L.L.P.

(57) ABSTRACT

The resin composition for sealing semiconductor according to the present invention is characterized by containing a maleimide-based compound represented by the following general formula (1), at least one of the benzoxazine-based compounds represented by the following general formula (2-1) and the following general formula (2-2), a curing catalyst, and an inorganic filler.

In the general formulae (1), (2-1) and (2-2), each of $X^2$, $X^3$ and $X^4$ independently represents an alkylene group having 1 to 10 carbon atoms, a group represented by the following general formula (3), a group represented by the formula "—$SO_2$—" or "—CO—", an oxygen atom or a single bond.

[Chemical Formula 1]

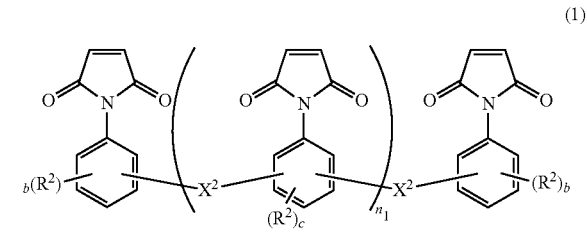

(1)

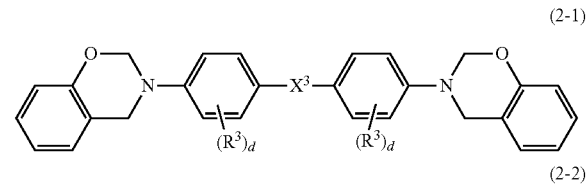

(2-1)

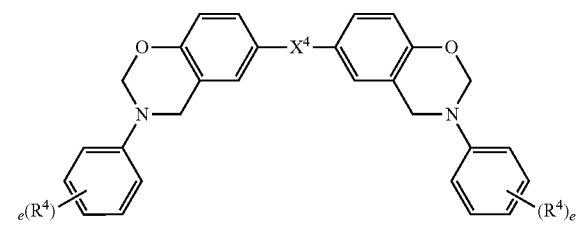

(2-2)

20 Claims, 2 Drawing Sheets

(51) Int. Cl.
  *H01L 23/495*   (2006.01)
  *C08G 73/02*   (2006.01)
  *C08K 5/357*   (2006.01)
  *C08K 5/3445*   (2006.01)
  *C08K 5/378*   (2006.01)
  *C08K 5/548*   (2006.01)
  *H01L 21/56*   (2006.01)
  *H01L 29/16*   (2006.01)
  *H01L 29/20*   (2006.01)
  *C08G 73/12*   (2006.01)
  *C08K 5/35*   (2006.01)
  *H01L 23/31*   (2006.01)

(56) References Cited

FOREIGN PATENT DOCUMENTS

| | | | |
|---|---|---|---|
| JP | 2003 221443 | 8/2003 | |
| JP | 2005 167035 | 6/2005 | |
| JP | 2009 161605 | 7/2009 | |
| JP | 2009 256626 | 11/2009 | |
| JP | 2010 6877 | 1/2010 | |
| JP | 2010 53334 | 3/2010 | |
| JP | 2012 97206 | 5/2012 | |
| JP | 2012 97207 | 5/2012 | |
| JP | 2013 185056 | 9/2013 | |
| WO | WO 2013015469 A1 * | 1/2013 | ............ C09J 161/06 |

OTHER PUBLICATIONS

International Search Report dated Sep. 16, 2014 in PCT/JP14/065461 Filed Jun. 11, 2014.

* cited by examiner

US 10,224,259 B2

RESIN COMPOSITION FOR SEALING SEMICONDUCTOR AND SEMICONDUCTOR DEVICE

CROSS-REFERENCE TO RELATED APPLICATIONS

The present application is a National Stage of International Application No. PCT/JP2014/065461, filed Jun. 11, 2014, which is based upon and claims the benefit of priority to Japanese Patent Application No. 2013-131198, filed Jun. 21, 2013. The entire contents of these applications are incorporated herein by reference.

TECHNICAL FIELD

The present invention relates to a resin composition for sealing semiconductor and a semiconductor device.

BACKGROUND ART

In recent years, from the viewpoints of the effective utilization of electrical energy and the like, SiC/GaN power semiconductor devices equipped with elements using SiC (silicon carbide) and GaN (gallium nitride) have been attracting attention (for example, see Patent Document 1.).

Since these elements can not only reduce the power loss greatly, as compared with the conventional elements using Si, but can also be operated with a higher voltage, a large current, and even in a high temperature reaching 300° C., they are expected to be deployed for use to which the application has been difficult with the conventional Si power semiconductor devices.

As described above, since the elements themselves (semiconductor elements) using SiC/GaN become operable under severe conditions as mentioned earlier, in order to protect these elements, a higher level of heat resistance than ever before has been required even for a semiconductor sealing material provided in the semiconductor devices.

Here, in the conventional Si power semiconductor devices, as a semiconductor sealing material, from the viewpoints of adhesive properties, electrical stability, and the like, those constituted of a cured product of epoxy-based resin composition as a main material have been generally used.

In such epoxy-based resin compositions, studies have been conducted to improve the heat resistance of the semiconductor sealing material obtained by using such resin compositions by employing techniques so as to increase the crosslinking density by lowering the epoxy group equivalent of the epoxy resin serving as a constituent material or the hydroxyl group equivalent of a curing agent (phenol resin curing agent), or to configure the structure connecting between these functional groups (epoxy groups and hydroxyl groups) into a rigid structure, or the like.

However, even by such studies, in the semiconductor sealing materials obtained by using the epoxy-based resin compositions, the heat resistance thereof was not necessarily improved sufficiently.

Accordingly, use of a cured product of a resin composition containing bismaleimide and benzoxazine as a semiconductor sealing material instead of the epoxy-based resin compositions has been considered (for example, see Non-Patent Document 1).

Although it is possible to improve the heat resistance by using a resin composition having such a configuration, as compared with the epoxy-based resin compositions, the actual situation is that further studies have been currently conducted on a resin composition capable of forming a semiconductor sealing material having heat resistance suitable for the use conditions of the Si power semiconductor devices.

CITATION LIST

Patent Document

[Patent Document 1] Japanese Unexamined Patent Application, First Publication No. 2005-167035

Non-Patent Document

[Non-Patent Document 1] Takeichi et. al, Polymer, Vol. 49, pp. 1173-1179 (2008)

SUMMARY OF INVENTION

Technical Problem

An object of the present invention is to provide a resin composition for sealing semiconductor which is capable of forming a semiconductor sealing material having excellent heat resistance and a semiconductor device obtained by sealing a semiconductor element with a cured product of the resin composition for sealing semiconductor and having excellent reliability.

Solution to Problem

The present invention includes the following aspects.

(1) A resin composition for sealing semiconductor characterized by containing:

a maleimide-based compound represented by the following general formula (1);

at least one of benzoxazine-based compounds represented by the following general formula (2-1) and the following general formula (2-2);

a curing catalyst; and an inorganic filler.

[Chemical Formula 1]

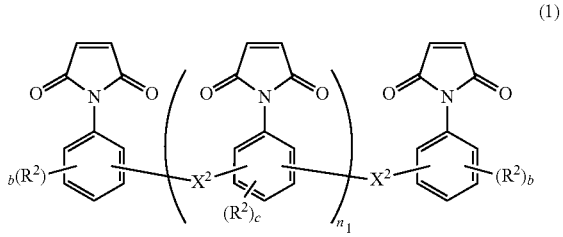

(1)

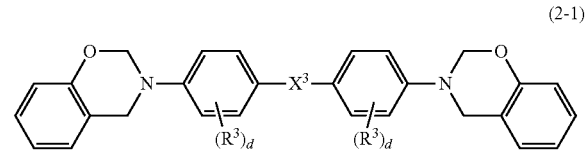

(2-1)

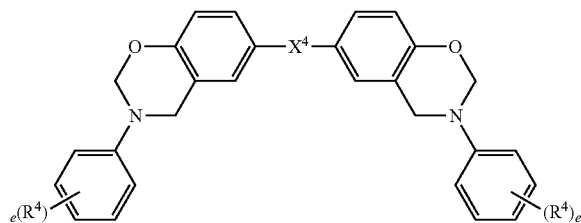

(2-2)

In the aforementioned general formulae (1), (2-1) and (2-2), each of $X^2$, $X^3$ and $X^4$ independently represents an alkylene group having 1 to 10 carbon atoms, a group represented by the following general formula (3), a group represented by the formula "—$SO_2$—" or "—CO—", an oxygen atom or a single bond. Each of $R^2$, $R^3$ and $R^4$ independently represents a hydrocarbon group having 1 to 6 carbon atoms. Each of b, d and e independently represents an integer of 0 to 4, and c is an integer of 0 to 3. $n_1$ is an integer of 1 or more.

[Chemical Formula 2]

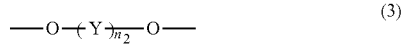

(3)

In the aforementioned general formula (3), Y represents a hydrocarbon group of 6 to 30 carbon atoms having an aromatic ring, and $n_2$ is an integer of 0 or more.

(2) The resin composition for sealing semiconductor according to the above aspect (1), in which the aforementioned $n_1$ in the aforementioned general formula (1) is an integer of 1 to 4.

(3) The resin composition for sealing semiconductor according to the above aspect (1) or (2), in which a blending ratio of the aforementioned maleimide-based compound represented by the general formula (1) and the aforementioned benzoxazine-based compound is from 1:0.1 to 1:4 in an equivalent ratio.

(4) The resin composition for sealing semiconductor according to any one of the above aspects (1) to (3), in which the aforementioned curing catalyst is an imidazole-based compound.

(5) The resin composition for sealing semiconductor according to any one of the above aspects (1) to (4), in which a content of the aforementioned curing catalyst is from 0.1 to 5.0 parts by mass with respect to the aforementioned maleimide-based compound and the aforementioned benzoxazine-based compound that total 100 parts by mass.

(6) The resin composition for sealing semiconductor according to any one of the above aspects (1) to (5), in which if an elastic modulus at 25° C. of a cured product obtained by curing the resin composition for sealing semiconductor is defined as A [GPa] and an elastic modulus at 250° C. of the aforementioned cured product is defined as B [GPa], a relationship of $0.1 \leq (A-B)/A \leq 0.9$ is satisfied.

(7) The resin composition for sealing semiconductor according to any one of the above aspects (1) to (6), in which a cured product obtained by curing the resin composition for sealing semiconductor has an elastic modulus A of 10 to 50 GPa at 25° C.

(8) The resin composition for sealing semiconductor according to any one of the above aspects (1) to (7), in which a cured product obtained by curing the resin composition for sealing semiconductor has an elastic modulus B of 1 to 30 GPa at 250° C.

(9) The resin composition for sealing semiconductor according to any one of the above aspects (1) to (8), in which a cured product obtained by curing the resin composition for sealing semiconductor has a five percent weight reducing temperature $T_{d5}$ of 450° C. or higher.

(10) The resin composition for sealing semiconductor according to any one of the above aspects (1) to (9), further containing an adhesive auxiliary.

(11) A semiconductor device characterized by being formed by sealing a semiconductor element with a cured product of the resin composition for sealing semiconductor according to any one of the above aspects (1) to (10).

(12) The semiconductor device according to the above aspect (11), in which the aforementioned semiconductor element is obtained by using SiC (silicon carbide) and/or GaN (gallium nitride).

Advantageous Effects of Invention

According to the present invention, due to the inclusion of a maleimide-based compound represented by the above general formula (1), at least one of the benzoxazine-based compounds represented by the above general formula (2-1) and the above general formula (2-2), a curing catalyst and an inorganic filler, it is possible to improve the heat resistance of a semiconductor sealing material constituted of a cured product thereof.

DESCRIPTION OF EMBODIMENTS

A resin composition for sealing semiconductor and a semiconductor device according to the present invention will be described below in detail based on preferred embodiments.

First, prior to explaining the resin composition for semiconductor sealing according to the present invention, a semiconductor device using the resin composition for sealing semiconductor according to the present invention (i.e., semiconductor device of the present invention) will be described.

<Semiconductor Device>

Figure 1:
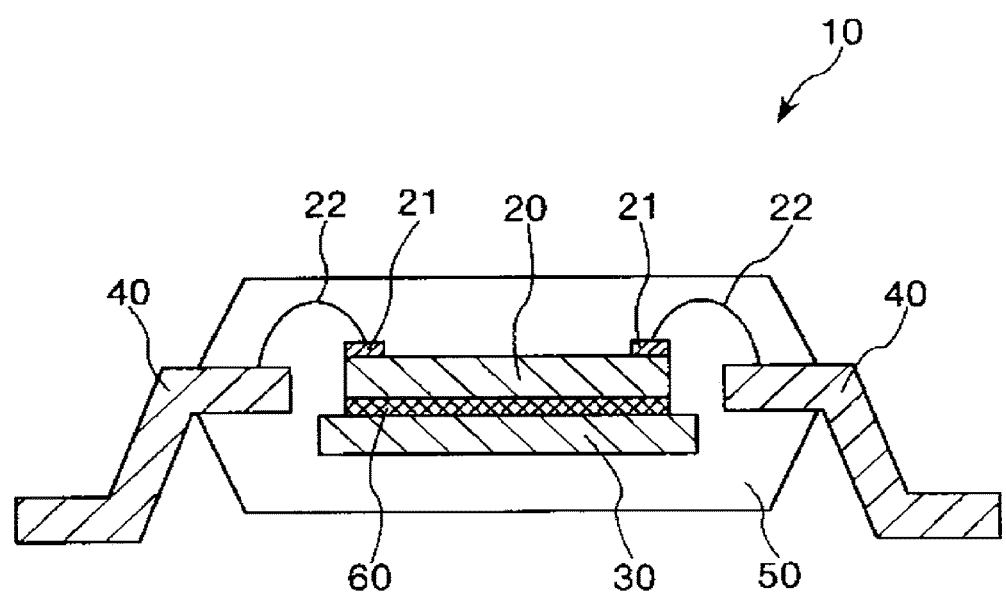
FIG. 1 is a longitudinal cross-sectional view showing an example of a semiconductor device using a resin composition for sealing semiconductor according to the present invention.

FIG. 1 is a longitudinal cross-sectional view showing an example of a semiconductor device using the resin composition for sealing semiconductor according to the present invention. In the following description, the upper side in FIG. 1 will be referred to as "upper" and the lower side in FIG. 1 will be referred to as "lower".

A semiconductor device 10 shown in FIG. 1 is a semiconductor package of a QFP (Quad Flat Package) type, and includes a semiconductor chip (semiconductor element) 20, a die pad 30 configured to support the semiconductor chip 20 via an adhesive layer 60, leads 40 electrically connected with the semiconductor chip 20 and a molded portion (sealing portion) 50 configured to seal the semiconductor chip 20.

The die pad 30 is constituted of a metal substrate and is one having a function as a support configured to support the semiconductor chip 20.

As the die pad 30, for example, a metal substrate constituted of various metal materials such as Cu, Fe, Ni and alloys thereof (for example, Cu-based alloys and iron/nickel-based alloys such as Fe-42Ni), one obtained by performing the silver plating or Ni—Pd plating on the surface of the metal substrate, one in which a gold plating (gold flash) layer is further provided on the Ni—Pd plating surface in order to improve the stability of the Pd layer, or the like is used.

In addition, the plan view shape of the die pad 30 usually corresponds to the plan view shape of the semiconductor chip 20, and is configured to be, for example, a quadrangular shape such as a square and a rectangle.

A plurality of leads 40 are provided radially in the outer peripheral portion of the die pad 30.

End portions of these leads 40 on the opposite side to the die pad 30 are projected (exposed) from the molded portion 50.

The leads 40 are constituted of an electrically conductive material, and, for example, the same constituent materials as those of the die pad 30 described earlier can be used.

In addition, in the leads 40, tin plating or the like may be applied to the surface thereof. As a result, in the case of connecting the semiconductor device 10 through solder to a terminal provided in a mother board, it is possible to improve the adhesion between the solder and the leads 40.

The semiconductor chip 20 is anchored (fixed) to the die pad 30 via the adhesive layer 60.

The adhesive layer 60 is not particularly limited, although it is formed, for example, by using various adhesives such as an epoxy-based adhesive, an acrylic adhesive, a polyimide-based adhesive and a cyanate-based adhesive.

In addition, the semiconductor chip 20 is constituted of, for example, one using SiC (silicon carbide) and GaN (gallium nitride).

The semiconductor chip 20 has electrode pads 21, and the electrode pads 21 and the leads 40 are electrically connected by wires 22. As a result, the semiconductor chip 20 and each of the leads 40 are electrically connected.

The material of the wires 22 is not particularly limited, although the wires 22 can be constituted by, for example, an Au wire or an Al wire.

Further, the die pad 30, the adhesive layer 60 provided on the upper surface side of the die pad 30, the semiconductor chip 20, the electrode pads 21, the wires 22, and portions of the leads 40 (inner portions) are sealed by the molded portion 50. Consequently, the remainder of the leads 40 (the end portions on the outer side) is protruding from the molded portion 50.

The molded portion (semiconductor sealing material) 50 is constituted by a cured product of the resin composition for sealing semiconductor according to the present invention.

The resin composition for sealing semiconductor (hereinafter, may be simply referred to as a "resin composition") will be described below.

<Resin Composition for Sealing Semiconductor>

The resin composition for sealing semiconductor according to the present invention (polybenzoxazine modified maleimide resin composition) contains a maleimide-based compound represented by the following general formula (1), at least one of benzoxazine-based compounds represented by the following general formula (2-1) and the following general formula (2-2), a curing catalyst, and an inorganic filler.

[Chemical Formula 3]

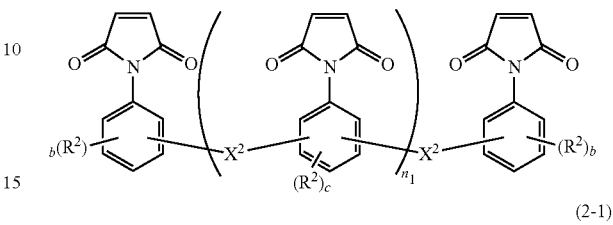

(1)

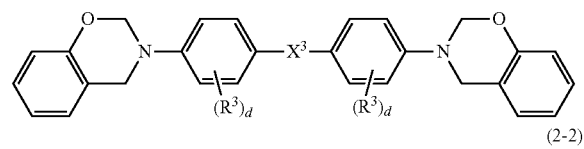

(2-1)

(2-2)

In the aforementioned general formulae (1), (2-1) and (2-2), each of $X^2$, $X^3$ and $X^4$ independently represents an alkylene group having 1 to 10 carbon atoms, a group represented by the following general formula (3), a group represented by the formula "—$SO_2$—" or "—CO—", an oxygen atom or a single bond. Each of $R^2$, $R^3$ and $R^4$ independently represents a hydrocarbon group having 1 to 6 carbon atoms. Each of b, d and e independently represents an integer of 0 to 4, and c is an integer of 0 to 3. $n_1$ is an integer of 1 or more.

[Chemical Formula 4]

(3)

In the aforementioned general formula (3), Y represents a hydrocarbon group of 6 to 30 carbon atoms having an aromatic ring, and $n_2$ is an integer of 0 or more.

As mentioned earlier, if the semiconductor chip 20 is configured using SiC (silicon carbide) and GaN (gallium nitride), the semiconductor chip 20 can be operated even under a high temperature reaching 300° C. For this reason, the molded portion 50 is required to have excellent heat resistance, and it becomes possible for the molded portion 50 to exhibit excellent heat resistance by configuring the molded portion 50 using a cured product of the resin composition having such a constitution.

[Maleimide-Based Compound]

The maleimide-based compound is constituted of a compound represented by the aforementioned general formula (1) (hereinafter, may be simply referred to as a "compound (1)"), and is one of the main materials contained in the resin composition.

In these compounds represented by the aforementioned general formula (1), $X^2$ represents an alkylene group having 1 to 10 carbon atoms, a group represented by the aforementioned general formula (3), a group represented by the formula "—SO$_2$—" or "—CO", an oxygen atom or a single bond.

The alkylene group having 1 to 10 carbon atoms represented by $X^2$ is not particularly limited, although a linear or branched alkylene group is preferred.

Specific examples of the linear alkylene group include a methylene group, an ethylene group, a propylene group, a butylene group, a pentylene group, a hexylene group, a heptylene group, an octylene group, a nonylene group, a decanylene group, a trimethylene group, a tetramethylene group, a pentamethylene group, and a hexamethylene group.

In addition, specific examples of the branched alkylene group include alkyl methylene groups such as —C(CH$_3$)$_2$— (isopropylene group), —CH(CH$_3$)—, —CH(CH$_2$CH$_3$)—, C(CH$_3$)(CH$_2$CH$_3$)—, —C(CH$_3$)(CH$_2$CH$_2$CH$_3$)—, and —C(CH$_2$CH$_3$)$_2$—; and alkyl ethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—.

The number of carbon atoms in the alkylene group represented by $X^2$, which may be 1 to 10, is preferably 1 to 7, and more preferably 1 to 3. Specific examples of the alkylene group having such a number of carbon atoms include a methylene group, an ethylene group, a propylene group, and an isopropylene group.

In addition, although $R^2$ represents a hydrocarbon group of 1 to 6 carbon atoms, it is preferably a hydrocarbon group having 1 or 2 carbon atoms, more specifically, for example, a methyl group or an ethyl group.

Furthermore, although b is an integer of 0 to 4, it is preferably an integer of 0 to 2, and more preferably 2. In addition, although c is an integer of 0 to 3, it is preferably an integer of 0 to 1, and more preferably 1.

Further, in the aforementioned maleimide-based compound represented by the general formula (1), $n_1$ is an integer of 1 or more, but is preferably 1 to 20, and more preferably 1 to 4. As a result, the molded portion 50 which is constituted of a cured product obtained from the resin composition becomes to exhibit more excellent heat resistance.

Furthermore, in the aforementioned group represented by the general formula (3), the group Y is a hydrocarbon group of 6 to 30 carbon atoms having an aromatic ring, and $n_2$ is an integer of 0 or more.

The hydrocarbon group of 6 to 30 carbon atoms having an aromatic ring may consist solely of an aromatic ring, or may have a hydrocarbon group other than the aromatic ring. The number of aromatic rings in the group Y may be one, or may be two or more, and if there are two or more rings, these aromatic rings may be the same or may be different. In addition, the aforementioned aromatic ring may have either a monocyclic structure or a polycyclic structure.

More specifically, as the hydrocarbon group of 6 to 30 carbon atoms having an aromatic ring, for example, divalent groups obtained by excluding two hydrogen atoms from the nucleus of a compound that has aromaticity, such as benzene, biphenyl, naphthalene, anthracene, fluorene, phenanthrene, indacene, terphenyl, acenaphthylene, and phenalene can be mentioned.

In addition, these aromatic hydrocarbon groups may have a substituent. Here, the expression "aromatic hydrocarbon group has a substituent" means that a portion or all of the hydrogen atoms constituting the aromatic hydrocarbon group are substituted by a substituent. Examples of the substituent include an alkyl group.

The alkyl group as the substituent is preferably a linear alkyl group. In addition, the number of carbon atoms is preferably from 1 to 10, more preferably from 1 to 6, and particularly preferably from 1 to 4. Specific examples thereof include a methyl group, an ethyl group, a propyl group, an isopropyl group, a butyl group, a tert-butyl group, and a sec-butyl group.

Such group Y preferably has a group obtained by removing two hydrogen atoms from benzene or naphthalene, and the group represented by the aforementioned general formula (3) is preferably a group represented by either of the following formulae (i) and (ii). As a result, the molded portion 50 which is constituted of a cured product obtained from the resin composition having such a group becomes to exhibit more excellent heat resistance.

[Chemical Formula 5]

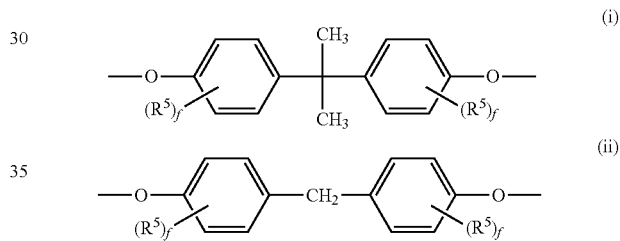

In the aforementioned formula, each of $R^5$ independently represents a hydrocarbon group having 1 to 6 carbon atoms. Each f independently represents an integer of 0 to 4, and more preferably 0.

Further, in the group represented by the aforementioned general formula (3), $n_2$ may be any integer of 0 or more, but is preferably an integer of 0 to 5, more preferably an integer of 1 to 3, and particularly preferably 1 or 2.

From the above, in the compound represented by the aforementioned general formula (1), it is preferable that the aforementioned $X^2$ is a linear or branched alkylene group having 1 to 3 carbon atoms, $R^2$ is one or two hydrocarbon groups, b is an integer of 0 to 2, and $n_1$ is an integer of 1 to 4. Alternatively, it is preferable that the aforementioned $X^2$ is a group represented by either of the aforementioned formulae (i) and (ii), and f is 0. As a result, the molded portion 50 which is constituted of a cured product obtained from the resin composition having such a group becomes to exhibit more excellent heat resistance.

Therefore, preferred specific examples of the compound represented by the aforementioned general formula (1) include those shown in the following formulae (1a), (1b), (1c), and (1d). Among these, compounds represented by the following formula (1a) are used more preferably.

[Chemical Formula 6]

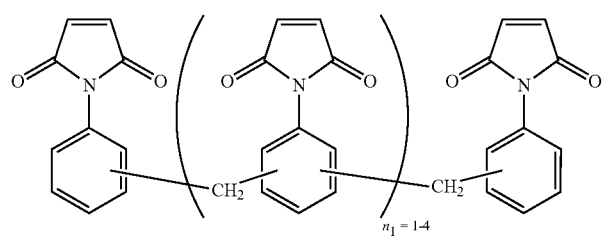

(1a)

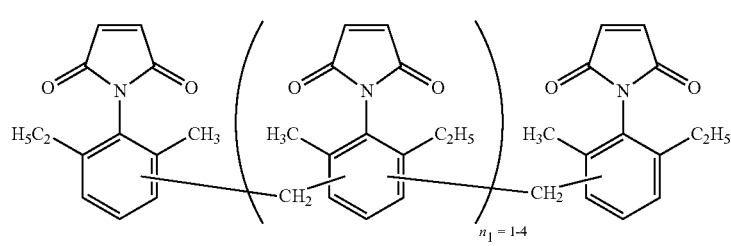

(1b)

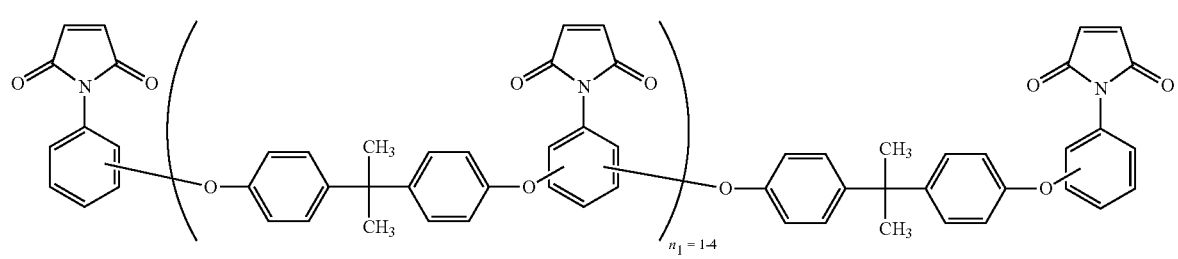

(1c)

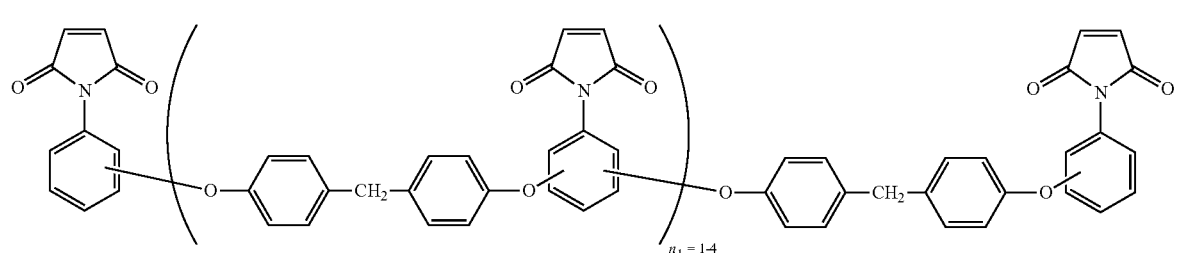

(1d)

[Benzoxazine-Based Compound]

The benzoxazine-based compound is constituted of at least one of the compounds represented by the aforementioned general formula (2-1) (hereinafter, may be referred to simply as a "compound (2-1)") and the compounds represented by the aforementioned general formula (2-2) (hereinafter, may be referred to simply as a "compound (2-2)"), and is one of the main materials contained in the resin composition.

In these compounds represented by the aforementioned general formula (2-1) and the compounds represented by the aforementioned general formula (2-2), each of $X^3$ and $X^4$ independently represents an alkylene group having 1 to 10 carbon atoms, a group represented by the aforementioned general formula (3), a group represented by the formula "—$SO_2$—" or "—CO—", an oxygen atom or a single bond.

Examples of $X^3$ and $X^4$ in the aforementioned general formula (2-1) and the aforementioned general formula (2-2) include the same as those described for $X^2$ in the aforementioned general formula (1). In addition, examples of $R^3$ and $R^4$ in the aforementioned general formula (2-1) and the aforementioned general formula (2-2) include the same as those described for $R^2$ in the aforementioned general formula (1). Furthermore, examples of d and e in the aforementioned general formula (2-1) and the aforementioned general formula (2-2) include the same as those described for b in the aforementioned general formula (1).

As such benzoxazine-based compounds, among the compounds represented by the aforementioned general formula (2-1) and the compounds represented by the aforementioned general formula (2-2), the compounds represented by the aforementioned general formula (2-1) are preferred. As a result, the molded portion 50 which is constituted of a cured product obtained from the resin composition becomes to exhibit more excellent heat resistance.

In addition, in the compound represented by the aforementioned general formula (2-1), it is preferable that the aforementioned $X^3$ is a linear or branched alkylene group having 1 to 3 carbon atoms, $R^3$ is one or two hydrocarbon groups, and d is an integer of 0 to 2. Alternatively, it is preferable that the aforementioned $X^3$ is a group represented by either of the aforementioned formulae (i) and (ii), and f is 0. As a result, the molded portion 50 which is constituted of a cured product obtained from the resin composition having such a group becomes to exhibit more excellent heat resistance.

Accordingly, preferred specific examples of the compound represented by the aforementioned general formula (2-1) include those represented by the following formulae (2-1a), (2-1b), (2-1c) and (2-1d) Among these, the compounds represented by the following formula (2-1a) are used more preferably.

tion of the maleimide-based compound represented by the aforementioned general formula (1) and at least one of the benzoxazine-based compounds represented by the aforementioned general formula (2-1) and the aforementioned general formula (2-2).

The curing catalyst is not particularly limited, and examples thereof include a phosphine compound, a compound having a phosphonium salt, and an imidazole-based compound. Among these, one type can be used alone or two or more types thereof can be used in combination. Among these, an imidazole-based compound is preferred. Since the imidazole-based compounds are those having a function as a particularly excellent catalyst as described above, the polymerization reaction of the maleimide-based compound represented by the aforementioned general formula (1) and at least one of the benzoxazine-based compounds repre-

[Chemical Formula 7]

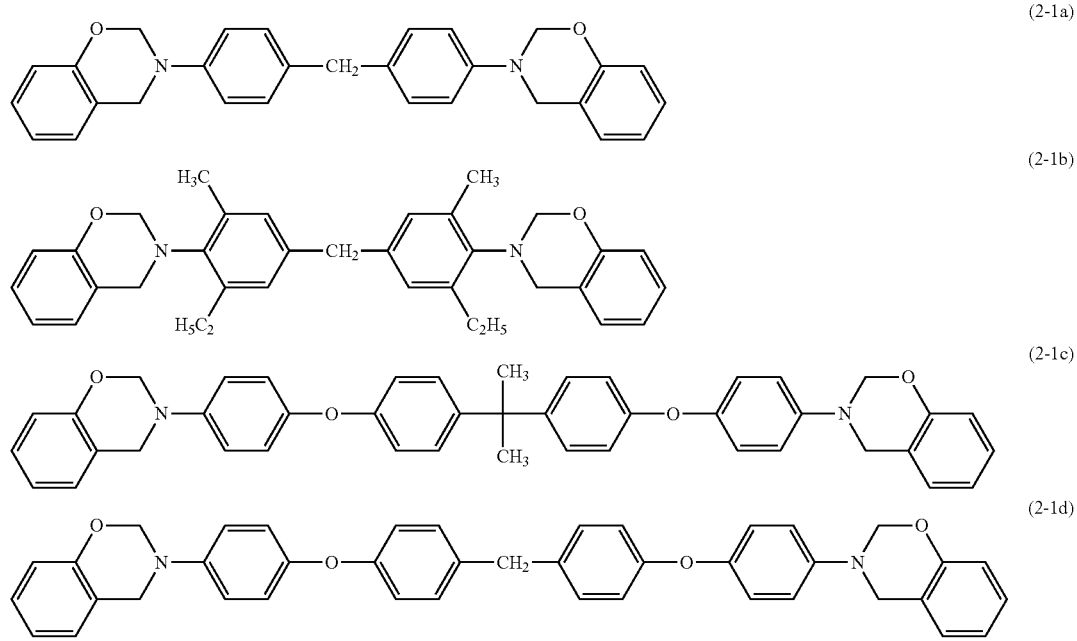

In addition, in the resin composition, the blending ratio of the maleimide-based compound represented by the above general formula (1) and at least one of the benzoxazine-based compounds represented by the above general formula (2-1) and the above general formula (2-2) is preferably, in equivalent ratio, from 1:0.1 to 1:4, and more preferably from 1:0.2 to 1:3. As a result, it is possible not only to improve the heat resistance of the molded portion 50 which is constituted of a cured product obtained from the resin composition, but also to achieve both the molding processability and the curability during the curing of the resin composition.

In the present specification, the aforementioned equivalent ratio refers to a ratio of the number of the maleimide groups in the maleimide-based compound and the number of benzoxazine groups in the benzoxazine-based compound which are contained in the resin composition.
[Curing Catalyst]

The curing catalyst is one of the main materials contained in the resin composition, and has a function as a catalyst (curing accelerator) to accelerate the polymerization reacsented by the aforementioned general formula (2-1) and the aforementioned general formula (2-2) can be accelerated more reliably.

The imidazole-based compound is not particularly limited, and examples thereof include 2-ethyl-4-methylimidazole, 2-methylimidazole, 2-ethylimidazole, 2,4-dimethylimidazole, 2-undecylimidazole, 2-heptadecylimidazole, 2-phenylimidazole, 2-phenyl-4-methylimidazole, 1-benzyl-2-methylimidazole, 2-phenyl-4,5-dihydroxymethylimidazole, 2-phenyl-4-methyl-5-hydroxymethylimidazole, 1-vinyl-2-methylimidazole, 1-propyl-2-methylimidazole, 2-isopropylimidazole, 1-cyanomethyl-2-methyl-imidazole, 1-cyanoethyl-2-ethyl-4-methylimidazole, 1-cyanoethyl-2-undecylimidazole, and 1-cyanoethyl-2-phenylimidazole. Among these, one type can be used alone or two or more types thereof can be used in combination. Among these, 2-methylimidazole, 2-phenylimidazole, 2-undecylimidazole, and 2-ethyl-4-methylimidazole are preferred. By using these compounds, the reaction of the aforementioned compounds is further promoted, and the advantages that the molding processability is improved and that the heat resistance of the resulting cured product is improved can be obtained.

The content of the curing catalyst (imidazole-based compound) is preferably from 0.1 to 5.0 parts by mass, more preferably from 0.1 to 3.0 parts by mass, and particularly preferably from 0.3 to 1.5 parts by mass, with respect to the maleimide-based compound represented by the above general formula (1) and benzoxazine-based compounds represented by the above general formula (2-1) and the above general formula (2-2) that total 100 parts by mass. By setting the content of the curing catalyst within such a range, it is possible to improve the heat resistance of the molded portion 50 which is constituted of a cured product obtained from the resin composition.

Examples of the phosphine compound include primary phosphines including alkylphosphines, such as ethylphosphine and propylphosphine, and phenylphosphine; secondary phosphines including dialkylphosphines, such as dimethylphosphine and diethylphosphine, diphenylphosphine, methylphenylphosphine, and ethylphenylphosphine; and tertiary phosphine including trialkylphosphines, such as trimethylphosphine, triethylphosphine, tributylphosphine, and tri octylphosphine, tricyclohexylphosphine, triphenylphosphine, alkyl diphenylphosphine, dialkylphenylphosphine, tribenzylphosphine, tritolylphosphine, tri-p-styrylphosphine, tris(2,6-dimethoxyphenyl)phosphine, tri-4-methylphenylphosphine, tri-4-methoxyphenylphosphine, and tri-2-cyanoethylphosphine. Among these, tertiary phosphines are preferably used.

In addition, as the compound having a phosphonium salt, compounds having a tetraphenylphosphonium salt, an alkyltriphenylphosphonium salt, and the like can be mentioned, and specific examples thereof include tetraphenylphosphonium thiocyanate, tetraphenylphosphonium tetra-p-methylphenylborate, and butyltriphenylphosphonium thiocyanate.

[Inorganic Filler]

The inorganic filler is one of the main materials contained in the resin composition, and has a function of reducing the increase in the amount of moisture absorption of the resin composition and the reduction in strength.

The inorganic filler is not particularly limited, and examples thereof include fused silica, crystalline silica, alumina, silicon nitride and aluminum nitride. Fused silica is preferably used, and spherical fused silica is more preferably used. One type of these inorganic fillers may be used alone or two or more types thereof may be mixed and used in combination. In addition, these may be surface treated by a coupling agent.

The particle size of the inorganic filler is preferably at least 0.01 μm and not greater than 150 μm, from the viewpoint of the filling properties into a mold cavity. Although the maximum particle size of the inorganic filler is not particularly limited, when considering the prevention of malfunction such as wire sweep which is caused by the coarse particles of the inorganic filler getting stuck in the narrow space between the wires, it is preferably 105 μm or less, and more preferably 75 μm or less.

The lower limit of the amount of the inorganic filler in the resin composition is preferably at least 65% by mass, more preferably at least 67% by mass, and still more preferably at least 70% by mass, with respect to the total mass of the resin composition. If the lower limit is within the above-mentioned range, the increase in the amount of moisture absorption and the reduction in strength due to curing of the resulting resin composition can be reduced, and it is therefore possible to obtain a cured product having excellent solder crack resistance.

In addition, the upper limit of the amount of the inorganic filler in the resin composition is preferably not more than 93% by mass, more preferably not more than 91% by mass, and still more preferably not more than 90% by mass, with respect to the total mass of the resin composition. If the upper limit is within the above range, the resulting resin composition exhibits excellent fluidity, as well as favorable moldability.

Among these, the amount of inorganic filler relative to the total mass of the resin composition is preferably at least 65% by mass and not more than 93% by mass, and more preferably at least 70% by mass and not more than 90% by mass.

[Other Components]

Moreover, in the resin composition for sealing semiconductor according to the present invention, other components as shown below may be further included, if necessary, in addition to the maleimide-based compound represented by the above general formula (1), at least one of the benzoxazine-based compounds represented by the above general formula (2-1) and the above general formula (2-2), the curing catalyst and the inorganic filler.

[Adhesive Auxiliary]

An adhesive auxiliary has a function of improving the adhesion between the molded portion 50 constituted of a cured product obtained by curing the resin composition and other members in the semiconductor device 10 other than the molded portion 50.

The adhesive auxiliary is not particularly limited, and, for example, a triazole-based compound and the like may be mentioned. Examples of the triazole-based compound include a compound having a 1,2,4-triazole ring and a compound having a 1,2,3-triazole ring. Specific examples thereof include 3-amino-1,2,4-triazole, 4-amino-1,2,3-triazole, 3-amino-1,2,4-triazole-5-carboxylic acid, 3-mercapto-1,2,4-triazole, 4-mercapto-1,2,3-triazole, 3,5-diamino-1,2,4-triazole, 3,5-dimercapto-1,2,4-triazole, 4,5-dimercapto-1,2,3-triazole, 3-amino-5-mercapto-1,2,4-triazole, 4-amino-5-mercapto-1,2,3-triazole, 3-hydrazino-4-amino-5-mercapto-1,2,4-triazole and 5-mercapto-1,2,4-triazole-3-methanol, and one type or two or more types of these in combination can be used. Among these, a 1,2,4 or 1,2,3-triazole compound having at least one mercapto group is preferred, and 3-amino-5-mercapto-1,2,4-triazole is more preferred.

The content of the adhesive auxiliary in the resin composition is preferably from 0.01 to 2 parts by mass, and more preferably from 0.03 to 1 part by mass, with respect to 100 parts by mass of the total resin composition. By setting the content of the adhesive auxiliary within this range, the aforementioned effects can be exhibited more remarkably.

In the case of using a triazole-based compound as an adhesive auxiliary, since the triazole-based compound also has a function of accelerating the polymerization reaction of the maleimide-based compound represented by the aforementioned general formula (1) and at least one of the benzoxazine-based compounds represented by the aforementioned general formula (2-1) and the aforementioned general formula (2-2), the adhesive auxiliary can be made to function as a curing catalyst.

[Coupling Agent]

Coupling agents are those having a function to improve adhesion between the resin component and the inorganic filler contained in the resin composition, and, for example, a silane coupling agent or the like is used.

It is possible to use various agents as the silane coupling agent, and examples thereof include an epoxysilane, an aminosilane, an alkylsilane, a ureidosilane, a mercaptosilane, a vinylsilane, and the like.

Specific examples thereof include γ-aminopropyltriethoxysilane, γ-aminopropyltrimethoxysilane, N-β(aminoethyl) γ-aminopropyltrimethoxysilane, N-β(aminoethyl)-γ-aminopropylmethyldimethoxysilane, N-phenyl-γ-aminopropyltriethoxysilane, N-phenyl-γ-aminopropyltrimethoxysilane, N-β(aminoethyl)-γ-aminopropyltriethoxysilane, N-6-(aminohexyl)-3-aminopropyltrimethoxysilane, N-(3-(trimethoxysilylpropyl)-1,3-benzenedimethanamine, γ-glycidoxypropyltriethoxysilane, γ-glycidoxypropyltrimethoxysilane, γ-glycidoxypropylmethyldimethoxysilane, β-(3,4-epoxycyclohexyl)ethyltrimethoxysilane, γ-mercaptopropyltrimethoxysilane, methyltrimethoxysilane, γ-ureidopropyltriethoxysilane and vinyltriethoxysilane, and one type or two or more types of these in combination can be used. Among these, epoxysilanes, mercaptosilanes and aminosilanes are preferred, and as an aminosilane, a primary aminosilane or an anilinosilane is more preferred.

The lower limit of the mixing ratio of the coupling agent such as a silane coupling agent is preferably at least 0.01% by mass, more preferably 0.05% by mass or more, and particularly preferably 0.1% by mass or more, in the total resin composition. If the lower limit of the mixing ratio of the coupling agent such as a silane coupling agent is within the above range, excellent solder cracking resistance in the semiconductor device can be obtained without lowering interfacial strength between the aforementioned resin component and the inorganic filler. In addition, the upper limit of the mixing ratio of the coupling agent such as a silane coupling agent is preferably equal to or less than 1% by mass, more preferably equal to or less than 0.8% by mass, and particularly preferably equal to or less than 0.6% by mass in the entire resin composition. If the upper limit of the mixing ratio of the silane coupling agent is within the above range, favorable solder cracking resistance in the semiconductor device can be obtained without lowering interfacial strength between the resin component and the inorganic filler. Of these, the mixing ratio of the coupling agent is preferably 0.01% by mass to 1% by mass, more preferably 0.05% by mass to 0.8% by mass, and still more preferably 0.1% by mass to 0.6% by mass in the entire rein composition.

Although the resin composition for sealing semiconductor which is used in the present invention contains the maleimide-based compound represented by the above general formula (1), at least one of the benzoxazine-based compounds represented by the above general formula (2-1) and the above general formula (2-2), the curing catalyst and the inorganic filler, in addition to other components described above, if necessary, various additives like mold releasing agents such as natural wax including carnauba wax and the like, synthetic wax including polyethylene wax and the like, higher fatty acids and the metal salts thereof such as stearic acid and zinc stearate, and paraffin; coloring agents such as carbon black, red iron oxide, titanium oxide, phthalocyanine and perylene black; ion trapping agents such as hydrotalcites and hydrous oxides of elements selected from magnesium, aluminum, bismuth, titanium and zirconium; low stress additives such as silicone oil and rubber; flame retardants such as brominated epoxy resin and antimony trioxide, aluminum hydroxide, magnesium hydroxide, zinc borate, zinc molybdate and phosphazene; and antioxidants such as hindered phenol and phosphorus compound, may be appropriately mixed.

By configuring the resin composition with the constituent materials described above, it is possible to improve the heat resistance of the molded portion 50 constituted of a cured product obtained by curing the resin composition. However, since the semiconductor device 10 having the molded portion 50 is required to be operated even in a high temperature reaching 300° C., the heat resistance of the molded portion (cured product) 50 is evaluated using, for example, indicators such as follows.

If an elastic modulus at 25° C. of a cured product obtained by curing the resin composition is defined as A [GPa] and an elastic modulus at 250° C. of the aforementioned cured product is defined as B [GPa], it is preferable to satisfy a relationship of $0.1 \leq (A-B)/A \leq 0.9$, and it is more preferable to satisfy a relationship of $0.1 \leq (A-B)/A \leq 0.7$.

Here, the indicator is obtained by dividing the difference between the elastic modulus A of the cured product at 25° C. and the elastic modulus B of the cured product at 250° C. with the elastic modulus A of the cured product at 25° C., and the smaller the difference between the elastic modulus A of the cured product at 25° C. and the elastic modulus B of the cured product at 250° C., the smaller the indicator value, that is, $[(A-B)/A]$. Furthermore, those in which the difference between the elastic modulus A of the cured product at 25° C. and the elastic modulus B of the cured product at 250° C. is small can be said to exhibit a small difference between the elastic modulus at normal temperatures (at the time of not driving semiconductor chips) and the elastic modulus at high temperatures (at the time of driving semiconductor chips) and excellent heat resistance. Therefore, by setting the value of $[(A-B)/A]$ within the aforementioned range, it is possible to make the molded portion 50 which is constituted of the cured product obtained by curing the resin composition exhibit excellent heat resistance.

In addition, the elastic modulus A of the cured product at 25° C. is preferably from 10 to 50 GPa, and more preferably from 15 to 25 GPa. By setting the elastic modulus A within such a range, the aforementioned value of $[(A-B)/A]$ can be easily set within the aforementioned range, and the aforementioned cured product can be made to exhibit excellent heat resistance more reliably.

Further, the elastic modulus B of the cured product at 250° C. is preferably from 1 to 30 GPa, and more preferably from 5 to 20 GPa. By setting the elastic modulus B within such a range, the aforementioned value of $[(A-B)/A]$ can be easily set within the aforementioned range, and the aforementioned cured product can be made to exhibit excellent heat resistance more reliably.

The elastic moduli at 25° C. and 250° C. can be determined, for example, by measuring from −30 up to 300° C., at a rate of temperature increase of 5° C./min and a frequency of 10 Hz, using a dynamic viscoelastic apparatus ("RSA3" manufactured by TA Instruments Inc.) and reading the elastic moduli at 25° C. and 250° C., respectively.

Furthermore, the cured product obtained by curing the resin composition preferably has a five percent weight reducing temperature $T_{d5}$ of 450° C. or higher, and more preferably 470° C. or higher. The molded portion (cured product) 50 having such a five percent weight reducing temperature $T_{d5}$ can be said to exhibit excellent heat resistance.

The five percent weight reducing temperature $T_{d5}$ of the cured product can be determined, for example, by measuring the weight loss under conditions of a nitrogen gas atmosphere and a rate of temperature increase of 10° C./min, using a thermogravimetric differential thermal analyzer ("EXSTAR TG/DTA6200" manufactured by Seiko Instruments Inc.) and reading the temperature at which the weight reduces by 5% relative to the weight at 25° C.

As the aforementioned cured product with which the aforementioned elastic moduli at 25° C. and 250° C. and the aforementioned five percent weight reducing temperature $T_{d5}$ are measured, those obtained by subjecting the resin composition to injection molding using a low-pressure transfer molding machine ("KTS-30" manufactured by Kohtaki Precision Machine Co., Ltd.) under conditions of a mold temperature of 200° C., an injection pressure of 9.8 MPa, and a curing time of 120 s, and forming the resultant into a size of 10 mm×55 mm and a thickness of 1.6 mm, followed by 4 hours of curing at 250° C. are used.

The resin composition for sealing semiconductor as described above can be produced, for example, by using a method of producing a resin composition for sealing semiconductor, such as the following.

<Method of Producing a Resin Composition for Sealing Semiconductor>

Figure 2:
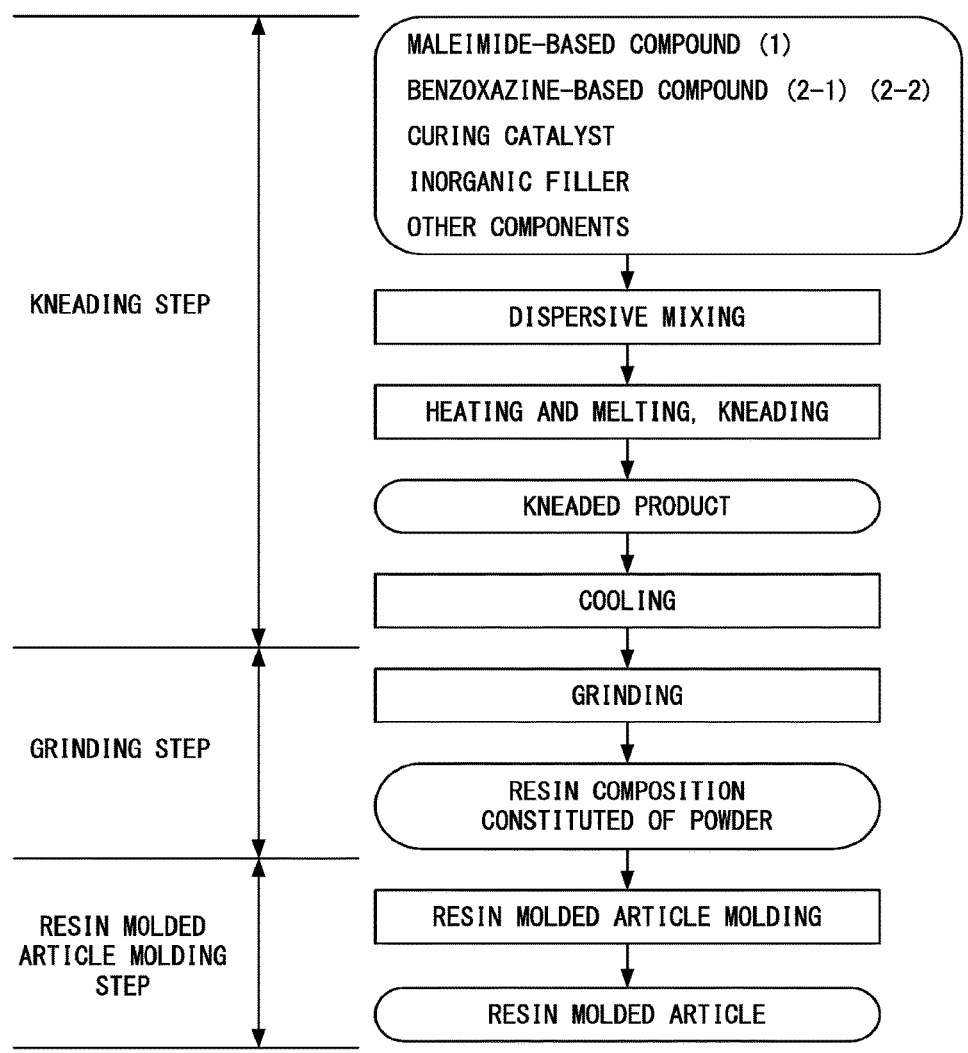
FIG. 2 is a process schematic view showing an example of a method of manufacturing a resin composition for sealing semiconductor.

FIG. 2 is a process schematic view showing an example of a method of producing a resin composition for sealing semiconductor.

Each step of the production method of the resin composition will be described below in order.

(Kneading Step)

The present step is a step of obtaining a kneaded product by mixing (dispersive mixing) the maleimide-based compound represented by the above general formula (1), at least one of the benzoxazine-based compounds represented by the above general formula (2-1) and the above general formula (2-2), the curing catalyst, the inorganic filler, and other compounds if necessary, and subjecting the resultant to heating, melting and kneading.

The present step will be described below in detail.

<1> First, a composition component is prepared by weighing the constituent materials of the resin composition described above, namely, the maleimide-based compound represented by the above general formula (1), at least one of the benzoxazine-based compounds represented by the above general formula (2-1) and the above general formula (2-2), the curing catalyst and the inorganic filler in predetermined amounts and blending them. Then, the composition component is uniformly ground and mixed (dispersively mixed) at room temperature using, for example, a mixer, a jet mill, a ball mill, and the like.

<2> Next, the composition component is melted while being heated by using a kneader to perform kneading, and after obtaining a kneaded product, the kneaded product is cooled.

The kneader is not particularly limited, and, for example, it is possible to use a heating roller, a kneader, an extruder, and the like.

In addition, the temperature at the time of melting the composition component slightly varies depending on the constituent materials of the composition component, but is usually set preferably from 50 to 150° C., and more preferably from 90 to 130° C. As a result, since it is possible to make both of the maleimide-based compound represented by the aforementioned general formula (1) and the benzoxazine-based compound represented by the aforementioned general formula (2-1) and/or the aforementioned general formula (2-2) into a melted state, a kneaded product constituted of a composition component in which each of the resin components contained in the composition component is uniformly distributed can be obtained reliably.

(Grinding Step)

The present step is a step of obtaining a resin composition (kneaded product which is a ground material) constituted of a powder by grinding the aforementioned kneaded product obtained in the kneading step.

At this time, grinding of the kneaded product can be carried out by at least one external force selected from the group consisting of compression, impact, shear, friction (milling) and freezing. More specifically, for example, pulverizing machines including airflow type pulverizers such as a wing mill (manufactured by Sansho Industry Co., Ltd.), a mighty mill (manufactured by Sansho Industry Co., Ltd.), and a jet mill; ball mills such as a vibration ball mill, a continuous type rotary ball mill, and a batch type ball mill; pot mills such as a wet pot mill and a planetary pot mill; a hammer mill; and a roller mill may be mentioned, and one type or two or more types of these can be used in combination. Among these, a jet mill, a ball mill, a hammer mill and a pot mill are preferred, and a jet mill is more preferred. As a result, it is possible to reliably obtain a powder having a median diameter, as described below.

The temperature at the time of obtaining a powder by pulverizing the kneaded product is preferably set at 40° C. or less, and more preferably from 10 to 30° C. As a result, the powder formed by pulverizing the kneaded product will be in a molten state. Due to this, since it is possible to reliably prevent the powders adjacent to each other from being aggregated and forming lumps, the powders become to maintain a particulate form.

The temperature at the time of obtaining a powder by pulverizing the kneaded product in the present invention is a temperature immediately after pulverizing the kneaded product.

In addition, for each of the constituent materials contained in the resin composition, in the case of using one to which the concept of melting point cannot be applied, its "melting point" means a "softening point" in the present specification.

By going through the steps as described above, it is possible to obtain a resin composition constituted of a powder.

Although the resin composition may be stored and transported as being constituted of a powder as described above, it may be formed into a resin molded article from the viewpoint of its ease of storage, transport and molding operations.

A case of obtaining a tablet using the above-mentioned powder as the resin molded article will be described below as an example.

(Resin Molded Article Molding Step)

The present step is a step of obtaining a resin composition constituted of a tablet (resin molded article) by molding (resin molded article molding) the resin composition constituted of the powder obtained in the grinding step into a tablet form.

The tablet (resin molded article) can be obtained, for example, by pressing and molding the aforementioned powder into a tablet form.

By going through the steps as described above, it is possible to obtain a resin composition constituted of a tablet.

The resin molded article is not limited to a tablet-shaped tablet, and may be in other forms such as a sheet, a strip, and a pellet.

Using the resin composition as described above, the semiconductor device 10 is manufactured, for example, by using a method of producing a semiconductor device as described below.

<Production Method of Semiconductor Device>

For the method of producing a semiconductor device, any one of the powder and the tablet constituted of the above-mentioned resin composition can be used.

Examples of the method of producing a semiconductor device using a tablet include a method in which the tablet is molded and cured by a molding method such as a transfer molding process and a compression molding process after placing each of the members constituting the semiconductor device 10 described above except for the molded portion 50 in a mold cavity, thereby sealing each of the members except for the molded portion 50.

Examples of the method of producing a semiconductor device using a powder include a method in which, using a powder with a particle size adjusted by sieving or the like, the resin composition constituted of the powder is molded and cured by applying a compression molding process, thereby sealing each of the members except for the molded portion 50.

In addition, the molding temperature is preferably set from 150 to 250° C., more preferably from 160 to 220° C., and still more preferably from 175 to 200° C.

Furthermore, the molding time is preferably set from 30 to 600 seconds, more preferably from 45 to 240 seconds, and still more preferably from 60 to 180 seconds.

The heating temperature in the case of conducting a PMC (post mold curing) process after molding the resin composition is not particularly limited, but is preferably, for example, from 150 to 250° C., and more preferably from 180 to 220° C.

In addition, the heating time in the case of conducting a PMC (post mold curing) process after molding is not particularly limited, but is preferably, for example, from 0.5 to 10 hours, and more preferably from 1 to 5 hours.

By setting the conditions at the time of conducting a PMC (post mold curing) process after molding the resin composition within the above ranges, it is possible to more reliably cure the resin composition.

Although a case of applying the semiconductor device 10 to a quad flat package (QFP) has been described in the present embodiment, it is not limited to such a case and can be applied to semiconductor packages in various forms. For example, it can be applied not only to packages used for memories or logic elements, such as a dual in-line package (DIP), a plastic leaded chip carrier (PLCC), a low-profile quad flat package (LQFP), a small outline package (SOP), a small outline J-lead package (SOJ), a thin small outline package (TSOP), a thin quad flat package (TQFP), a tape carrier package (TCP), a ball grid array (BGA), a chip size package (CSP), a matrix array package ball grid array (MAPBGA), and a chip-stacked chip size package, but also to packages such as TO-220 equipped with a power element such as a power transistor.

Although the resin composition for sealing semiconductor and the semiconductor device according to the present invention have been described above, the present invention is not limited thereto.

For example, an optional component which can achieve the same function may be added to the resin composition for sealing semiconductor according to the present invention.

In addition, the configuration of each part of the semiconductor device of the present invention can be substituted with any of those capable of achieving the same function, or any of the configurations may be added.

EXAMPLES

Next, specific Examples of the present invention will be described.

The present invention is not limited in any way by the description of these Examples.

1. Preparation of Raw Materials

First, raw materials used in the resin composition of each of the Examples and Comparative Examples are shown below.

Unless otherwise specified, the amount of each component added is in parts by mass.

(Maleimide-Based Compound 1)

As a maleimide-based compound (BMI) 1, a compound represented by the aforementioned formula (1a) was prepared. It should be noted that $n_1$ of the compound was 1.6 on average, the mass average molecular weight was 654, and the maleimide equivalent was 182 g/eq.

(Maleimide-Based Compound 2)

As a maleimide-based compound (BMI) 2, a compound represented by the following formula (1a') was prepared. The molecular weight of the compound was 358, and the maleimide equivalent was 179 g/eq.

[Chemical Formula 8]

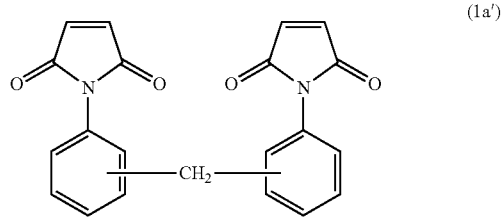

(1a')

(Benzoxazine-Based Compound 1)

As a benzoxazine-based compound (P-d type benzoxazine) 1, a compound represented by the aforementioned formula (2-1a) was prepared. The molecular weight of the compound was 434, and the benzoxazine equivalent was 217 g/eq.

(Benzoxazine-Based Compound 2)

As a benzoxazine-based compound (F-a type benzoxazine) 2, a compound represented by the following formula (4) was prepared. The molecular weight of the compound was 436, and the benzoxazine equivalent was 218 g/eq.

[Chemical Formula 9]

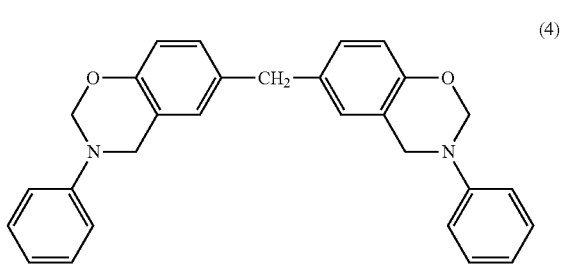

(4)

(Epoxy-Based Compound 1)

As an epoxy-based compound 1, a tetramethylbiphenyl type epoxy resin (YX4000K manufactured by Mitsubishi Chemical Corporation, epoxy equivalent: 185 g/eq) was prepared.

(Phenolic Compound 1)

As a phenolic compound 1, a phenol novolak type phenol resin (PR-51714, manufactured by Sumitomo Bakelite Co., Ltd., hydroxyl group equivalent: 104 g/eq) was prepared.

(Imidazole-Based Compound 1)

As an imidazole-based compound 1, 2-methylimidazole was prepared.

(Imidazole-Based Compound 2)

As an imidazole-based compound 2, 2-undecylimidazole was prepared.

(Adhesive Auxiliary 1)

As an adhesive auxiliary 1, 3-amino-5-mercapto-1,2,4-triazole was prepared.

(Adhesive Auxiliary 2)

As an adhesive auxiliary 2, 4-amino-1,2,3-triazole was prepared.

(Inorganic Filler 1)

As an inorganic filler 1, fused spherical silica (average particle size: 30 μm) was prepared.

(Silane Coupling Agent 1)

As a silane coupling agent 1, γ-mercaptopropyltrimethoxysilane was prepared.

2. Production of Resin Composition

Example 1

First, the maleimide-based compound 1 (71.43 parts by mass), the benzoxazine-based compound 1 (28.57 parts by mass), the imidazole-based compound 1 (1.00 part by mass), the inorganic filler 1 (365.00 parts by mass), the adhesive auxiliary 1 (1.00 part by mass) and the silane coupling agent 1 (0.50 parts by mass) were weighed respectively, and these were mixed together using a mixer, and then kneaded for 5 minutes at 100° C. using a roll, thereby obtaining a kneaded product. Then, the kneaded product was pulverized after cooling to thereby obtain a resin composition of Example 1 which was constituted of a powder.

Examples 2 to 10, Comparative Examples 1 and 2

The resin compositions of Examples 2 to 10 and Comparative Examples 1 and 2 were obtained in the same manner as in Example 1 with the exception that the types and amounts to be weighed of the maleimide-based compound, benzoxazine-based compound, curing catalyst, adhesive auxiliary, inorganic filler and silane coupling agent were changed to those as shown in Table 1.

Comparative Example 3

The resin composition of Comparative Example 3 was obtained in the same manner as in Example 1 with the exception that in place of the maleimide-based compound 1 (71.43 parts by mass) and the benzoxazine-based compound 1 (28.57 parts by mass), the epoxy-based compound 1 (64.00 parts by mass) and the phenolic compound 1 (36.00 parts by mass) were added.

Comparative Example 4

The resin composition of Comparative Example 4 was obtained in the same manner as in Example 1 with the exception that the addition of inorganic filler 1 (365.00 parts by mass) was omitted.

3. Evaluation

The resulting resin composition of each of the Examples and Comparative Examples was evaluated by the following methods.

3-1. Evaluation of Elastic Modulus

The resin composition of each of the Examples and Comparative Examples was subjected to injection molding, using a low-pressure transfer molding machine ("KTS-30" manufactured by Kohtaki Precision Machine Co., Ltd.) under conditions of a mold temperature of 200° C., an injection pressure of 9.8 MPa, and a curing time of 120 s, and formed into a size of 10 mm×55 mm and a thickness of 1.6 mm, followed by 4 hours of curing at 250° C. to thereby produce a test piece of each of the Examples and Comparative Examples.

Next, for the test piece of each of the Examples and Comparative Examples, the elastic modulus A at 25° C. and the elastic modulus B at 250° C. were determined by measuring from −30 up to 300° C., at a rate of temperature increase of 5° C./min and a frequency of 10 Hz, using a dynamic viscoelastic apparatus ("RSA3" manufactured by TA Instruments Inc.), and reading the values at 25° C. and at 250° C., respectively.

Then, the ratio of (A−B)/A was determined from the obtained elastic modulus A at 25° C. and the elastic modulus B at 250° C.

3-2. Evaluation of Five Percent Weight Reducing Temperature $T_{d5}$

The resin composition of each of the Examples and Comparative Examples was subjected to injection molding, using a low-pressure transfer molding machine ("KTS-30" manufactured by Kohtaki Precision Machine Co., Ltd.) under conditions of a mold temperature of 200° C., an injection pressure of 9.8 MPa, and a curing time of 120 s, formed into a size of 10 mm×55 mm and a thickness of 1.6 mm, and cured for 4 hours at 250° C., followed by grinding to thereby produce a test sample of each of the Examples and Comparative Examples.

Next, for the test sample of each of the Examples and Comparative Examples, the five percent weight reducing temperature $T_{d5}$ was determined by measuring the weight loss under conditions of a nitrogen gas atmosphere and a rate of temperature increase of 10° C./min, using a thermogravimetric differential thermal analyzer ("EXSTAR TG/DTA6200" manufactured by Seiko Instruments Inc.) and reading the temperature at which the weight reduces by 5% relative to the weight at 25° C.

3-3. Evaluation of Molding Processability

The sealing resin composition of each of the Examples and Comparative Examples was injected into a mold for spiral flow measurement which was in accordance with EMMI-1-66 and subjected to curing, using a low-pressure transfer molding machine (KTS-15 manufactured by Kohtaki Precision Machine Co., Ltd.) under conditions of a mold temperature of 200° C., an injection pressure of 6.9 MPa, and a pressure-holding time of 120 seconds, to thereby measure a spiral flow.

In addition, for the criteria, those having a spiral flow of 80 cm to 250 cm were evaluated as A, and those having a spiral flow of less than 80 cm or greater than 250 cm were evaluated as B.

3-4. Evaluation of Curability

The gel time was evaluated as an evaluation of curability. The time from the placing of the resin composition of each of the Examples and Comparative Examples on a hot plate with a surface temperature of 200° C. until it became tack-free was measured and used as the gel time.

In addition, for the criteria, those having a gel time value of 10 seconds to 40 seconds were evaluated as A, and those having a gel time value of less than 10 seconds or greater than 40 seconds were evaluated as B.

3-5. Temperature Cycle Test

A 160-pin LQFP (having a package size of 24 mm×24 mm, a thickness of 1.4 mm, a SiC chip size of 7.0 mm×7.0 mm, and a lead frame made of Cu) was molded, using a low-pressure transfer molding machine ("KTS-30" manufactured by Kohtaki Precision Machine Co., Ltd.) at a mold temperature of 200° C., an injection pressure of 9.8 MPa, and a curing time of 120 s, and cured for 4 hours at 250° C. to thereby produce a test element. The sealed test element was repeatedly subjected to 500 cycles or 1000 cycles of a temperature change from −65° C. to 250° C. to determine the presence or absence of package cracks and detachment between the members ((number of defects)/(number of samples)).

3-6. High Temperature Storage Test

The test element produced in the same manner as in 3-5 was subjected to a heat treatment of 500 hours or 1,000 hours in a continuous manner at 250° C. to determine the presence or absence of package cracks and detachment between the members ((number of defects)/(number of samples)).

The evaluation results of the resin composition of each of the Examples and Comparative Examples obtained as described above are shown in the following Table 1, respectively.

TABLE 1

| | Examples | | | | | |
|---|---|---|---|---|---|---|
| | 1 | 2 | 3 | 4 | 5 | 6 |
| Maleimide-based compound 1 formula (1a) ($n_1$ = 1.6) | 71.43 | 71.43 | 71.43 | 71.43 | 71.43 | 71.43 |
| Maleimide-based compound 2 formula (1a') | | | | | | |
| Benzoxazine-based compound 1 formula (2-1a) | 28.57 | 28.57 | 28.57 | 28.57 | 28.57 | |
| Benzoxazine-based compound 2 formula (4) | | | | | | 28.57 |
| Epoxy-based compound 1 | | | | | | |
| Phenolic compound 1 | | | | | | |
| Imidazole-based compound 1 2-methylimidazole | 1.00 | 1.00 | 1.00 | 4.00 | 0.20 | 1.00 |
| Imidazole-based compound 2 2-undecylimidazole | | | | | | |
| Phosphorus-based compound 1 triphenylphosphine | | | | | | |
| Inorganic filler 1 fused spherical silica | 365.00 | 685.00 | 240.00 | 365.00 | 365.00 | 365.00 |
| Adhesive auxiliary 1 3-amino-5-mercapto-1,2,4-triazole | 1.00 | 1.00 | 1.00 | 1.00 | | 1.00 |
| Adhesive auxiliary 2 4-amino-1,2,3-triazole | | | | | 1.00 | |
| Silane coupling agent 1 γ-mercaptopropyltrimethoxysilane | 0.50 | 0.50 | 0.50 | 0.50 | 0.50 | 0.50 |
| Elastic modulus — Elastic modulus A [MPa] at 25° C. of cured product | 17,000 | 26,000 | 10,000 | 17,000 | 15,000 | 16,000 |
| Elastic modulus B [MPa] at 250° C. of cured product | 14,000 | 23,000 | 5,000 | 15,000 | 10,000 | 12,000 |
| (A-B)/A | 0.18 | 0.12 | 0.50 | 0.12 | 0.33 | 0.25 |
| Five percent weight reducing temperature Td5 (° C.) | 475 | 480 | 473 | 475 | 472 | 467 |
| Molding processability (spiral flow) | A | A | A | A | A | A |
| Curability (gel time) | A | A | A | A | A | A |
| Temperature cycle test (500 cycles) (number of defects)/(number of samples) | 0/20 | 0/20 | 0/20 | 0/20 | 0/20 | 0/20 |
| Temperature cycle test (1,000 cycles) (number of defects)/(number of samples) | 0/20 | 0/20 | 0/20 | 0/20 | 0/20 | 0/20 |
| High temperature storage test (500 hours) (number of defects)/(number of samples) | 0/20 | 0/20 | 0/20 | 0/20 | 0/20 | 0/20 |
| High temperature storage test (1,000 hours) (number of defects)/(number of samples) | 0/20 | 0/20 | 0/20 | 0/20 | 0/20 | 0/20 |

| | Examples | | | |
|---|---|---|---|---|
| | 7 | 8 | 9 | 10 |
| Maleimide-based compound 1 formula (1a) ($n_1$ = 1.6) | 71.43 | 71.43 | 50.00 | 95.24 |
| Maleimide-based compound 2 formula (1a') | | | | |
| Benzoxazine-based compound 1 formula (2-1a) | 28.57 | 28.57 | 50.00 | 4.76 |
| Benzoxazine-based compound 2 formula (4) | | | | |
| Epoxy-based compound 1 | | | | |
| Phenolic compound 1 | | | | |
| Imidazole-based compound 1 2-methylimidazole | | | 1.00 | 1.00 |
| Imidazole-based compound 2 2-undecylimidazole | 1.00 | | | |
| Phosphorus-based compound 1 triphenylphosphine | | 1.00 | | |
| Inorganic filler 1 fused spherical silica | 365.00 | 365.00 | 365.00 | 365.00 |
| Adhesive auxiliary 1 3-amino-5-mercapto-1,2,4-triazole | 1.00 | 1.00 | 1.00 | 1.00 |
| Adhesive auxiliary 2 4-amino-1,2,3-triazole | | | | |
| Silane coupling agent 1 γ-mercaptopropyltrimethoxysilane | 0.50 | 0.50 | 0.50 | 0.50 |
| Elastic modulus — Elastic modulus A [MPa] at 25° C. of cured product | 17,000 | 16,000 | 15,000 | 17,000 |
| Elastic modulus B [MPa] at 250° C. of cured product | 13,000 | 11,000 | 11,000 | 15,000 |
| (A-B)/A | 0.24 | 0.31 | 0.26 | 0.12 |
| Five percent weight reducing temperature Td5 (° C.) | 471 | 473 | 470 | 480 |
| Molding processability (spiral flow) | A | A | A | A |
| Curability (gel time) | A | A | A | A |
| Temperature cycle test (500 cycles) (number of defects)/(number of samples) | 0/20 | 0/20 | 0/20 | 0/20 |
| Temperature cycle test (1,000 cycles) (number of defects)/(number of samples) | 0/20 | 0/20 | 0/20 | 0/20 |
| High temperature storage test (500 hours) (number of defects)/(number of samples) | 0/20 | 0/20 | 0/20 | 0/20 |
| High temperature storage test (1,000 hours) (number of defects)/(number of samples) | 0/20 | 0/20 | 0/20 | 0/20 |

TABLE 1-continued

| | Comparative Examples | | | |
|---|---|---|---|---|
| | 1 | 2 | 3 | 4 |
| Maleimide-based compound 1 formula (1a) ($n_1$ = 1.6) | | | | 71.43 |
| Maleimide-based compound 2 formula (1a') | 90.00 | 40.00 | | |
| Benzoxazine-based compound 1 formula (2-1a) | 10.00 | 60.00 | | 28.57 |
| Benzoxazine-based compound 2 formula (4) | | | | |
| Epoxy-based compound 1 | | | 64.00 | |
| Phenolic compound 1 | | | 36.00 | |
| Imidazole-based compound 1 2-methylimidazole | 1.00 | 1.00 | 1.00 | 1.00 |
| Imidazole-based compound 2 2-undecylimidazole | | | | |
| Phosphorus-based compound 1 triphenylphosphine | | | | |
| Inorganic filler 1 fused spherical silica | 365.00 | 365.00 | 365.00 | |
| Adhesive auxiliary 1 3-amino-5-mercapto-1,2,4-triazole | 1.00 | 1.00 | 1.00 | 1.00 |
| Adhesive auxiliary 2 4-amino-1,2,3-triazole | | | | |
| Silane coupling agent 1 γ-mercaptopropyltrimethoxysilane | 0.50 | 0.50 | 0.50 | 0.50 |
| Elastic modulus    Elastic modulus A [MPa] at 25° C. of cured product | 16000 | 15000 | 16000 | Unable to mold |
| Elastic modulus B [MPa] at 250° C. of cured product | 13000 | 2000 | 1000 | Unable to mold |
| (A−B)/A | 0.19 | 0.87 | 0.94 | Unable to mold |
| Five percent weight reducing temperature Td5 (° C.) | 440 | 430 | 395 | Unable to mold |
| Molding processability (spiral flow) | B | A | A | B |
| Curability (gel time) | B | B | A | B |
| Temperature cycle test (500 cycles) (number of defects)/(number of samples) | 2/20 | 5/20 | 20/20 | Unable to mold |
| Temperature cycle test (1,000 cycles) (number of defects)/(number of samples) | 6/20 | 14/20 | 20/20 | Unable to mold |
| High temperature storage test (500 hours) (number of defects)/(number of samples) | 2/20 | 6/20 | 20/20 | Unable to mold |
| High temperature storage test (1,000 hours) (number of defects)/(number of samples) | 5/20 | 13/20 | 20/20 | Unable to mold |

Epoxy based compound 1: Tetramethylbiphenyl type epoxy resin (YX4000K manufactured by Mitsubishi Chemical Corporation, epoxy equivalent: 185 g/eq)
Phenolic compound 1: Phenol novolak type phenol resin (PR-51714, manufactured by Sumitomo Bakelite Co., Ltd., hydroxyl group equivalent: 104 g/eq)

As shown in Table 1, in each example, the results of the temperature cycle test and the high temperature storage test were satisfactory, and the heat resistance was excellent. In addition, in each example, the results showed that the value of (A−B)/A was in the range of 0.1 to 0.9, and moreover, the five percent weight reducing temperature $T_{d5}$ was equal to or higher than 450° C., and the molding processability and the curability were excellent.

On the other hand, in Comparative Examples 1 to 3, the results showed that defects occurred in both the temperature cycle test and the high temperature storage test, and the heat resistance, the molding processability and the curability were poor, as compared with each Example. In addition, the molding processability and the curability were poor in Comparative Example 4 in which no inorganic filler was added, and it was not possible to produce a test sample.

INDUSTRIAL APPLICABILITY

According to the present invention, a resin composition for sealing semiconductor which is capable of forming a semiconductor sealing material excellent in heat resistance, molding processability, and curability is provided.

REFERENCE SIGNS LIST

10: Semiconductor device
20: Semiconductor chip
21: Electrode pad
22: Wire
30: Die pad
40: Lead
50: Molded portion (semiconductor sealing material)

The invention claimed is:
1. A resin composition for sealing semiconductor, comprising:

a maleimide-based compound of formula (1a);

at least one of a benzoxazine-based compound of formula (2-1a) and a benzoxazine-based compound of formula 4;

a curing catalyst;

an inorganic filler; and an adhesive auxiliary,

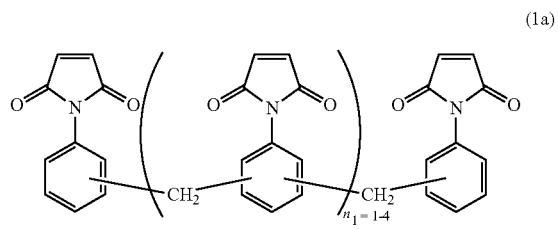

(1a)

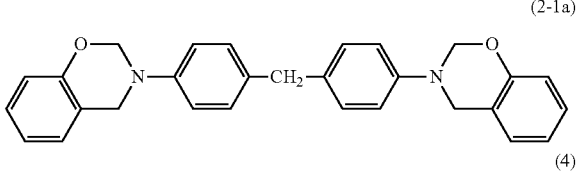

(2-1a)

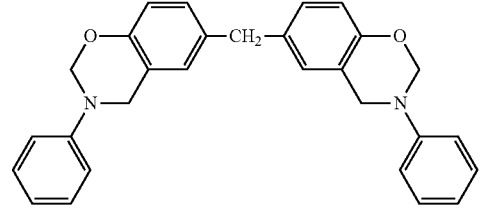

(4)

wherein the adhesive auxiliary is a triazole-based compound, the curing catalyst is an imidazole-based compound, and the inorganic filler is a fused silica, in the formula (1a) $n_1$ is an integer of 1 to 4.

2. The resin composition for sealing semiconductor according to claim 1, wherein a blending ratio of the maleimide-based compound of the formula (1a) and the benzoxazine-based compound is from 1:0.1 to 1:4 in an equivalent ratio.

3. The resin composition for sealing semiconductor according to claim 1, wherein the curing catalyst is included in an amount of from 0.1 to 5.0 parts by mass with respect to 100 parts by mass of a total of the maleimide-based compound and the benzoxazine-based compound.

4. The resin composition for sealing semiconductor according to claim 1, wherein when an elastic modulus at 25° C. of a cured product obtained by curing the resin composition for sealing semiconductor is A in GPa and an elastic modulus at 250° C. of the cured product is B in GPa, A and B satisfy a relationship of $0.1 \leq (A-B)/A \leq 0.9$.

5. The resin composition for sealing semiconductor according to claim 1, wherein a cured product obtained by curing the resin composition for sealing semiconductor has an elastic modulus A of 10 to 50 GPa at 25° C.

6. The resin composition for sealing semiconductor according to claim 1, wherein a cured product obtained by curing the resin composition for sealing semiconductor has an elastic modulus B of 1 to 30 GPa at 250° C.

7. The resin composition for sealing semiconductor according to claim 1, wherein a cured product obtained by curing the resin composition for sealing semiconductor has a five percent weight reducing temperature $T_{d5}$ of 450° C. or higher.

8. A semiconductor device formed by a process comprising sealing a semiconductor element with a cured product of the resin composition for sealing semiconductor according to claim 1.

9. The semiconductor device according to claim 8, wherein the semiconductor element comprises at least one of silicon carbide and gallium nitride.

10. The resin composition for sealing semiconductor according to claim 2, wherein the curing catalyst is included in an amount of from 0.1 to 5.0 parts by mass with respect to 100 parts by mass of a total of the maleimide-based compound and the benzoxazine-based compound.

11. The resin composition for sealing semiconductor according to claim 1, wherein the triazole-based compound is selected from the group consisting of 3-amino-1,2,4-triazole, 4-amino-1,2,3-triazole, 3-amino-1,2,4-triazole-5-carboxylic acid, 3-mercapto-1,2,4-triazole, 4-mercapto-1,2,3-triazole, 3,5-diamino-1,2,4-triazole, 3,5-dimercapto-1,2,4-triazole, 4,5-dimercapto-1,2,3-triazole, 3-amino-5-mercapto-1,2,4-triazole, 4-amino-5-mercapto-1,2,3-triazole, 3-hydrazino-4-amino-5-mercapto-1,2,4-triazole, and 5-mercapto-1,2,4-triazole-3-methanol.

12. The resin composition for sealing semiconductor according to claim 11, wherein a blending ratio of the maleimide-based compound of the formula (1a) and the benzoxazine-based compound is from 1:0.1 to 1:4 in an equivalent ratio, and the curing catalyst is included in an amount of from 0.1 to 5.0 parts by mass with respect to 100 parts by mass of a total of the maleimide-based compound and the benzoxazine-based compound.

13. The resin composition for sealing semiconductor according to claim 1, wherein the triazole-based compound is 3-amino-5-mercapto-1,2,4-triazole.

14. The resin composition for sealing semiconductor according to claim 1, wherein the curing catalyst is included in an amount of from 0.3 to 1.5 parts by mass with respect to the maleimide-based compound of formula (1a) and the benzoxazine-based compound that total 100 parts by mass, and the inorganic filler is in an amount of from 65% by mass to 93% by mass with respect to a total mass of the resin composition.

15. The resin composition for sealing semiconductor according to claim 1, further comprising:
a silane coupling agent in an amount of from 0.1% by mass to 0.6% by mass with respect to a total mass of the resin composition.

16. The resin composition for sealing semiconductor according to claim 1, wherein the triazole-based compound is 3-amino-5-mercapto-1,2,4-triazole, the curing catalyst is included in an amount of from 0.3 to 1.5 parts by mass with respect to the maleimide-based compound of formula (1a) and the benzoxazine-based compound that total 100 parts by mass, and the inorganic filler is in an amount of from 65% by mass to 93% by mass with respect to a total mass of the resin composition.

17. The resin composition for sealing semiconductor according to claim 13, further comprising:
a silane coupling agent in an amount of from 0.1% by mass to 0.6% by mass with respect to a total mass of the resin composition.

18. The resin composition for sealing semiconductor according to claim 14, further comprising:
a silane coupling agent in an amount of from 0.1% by mass to 0.6% by mass with respect to a total mass of the resin composition.

19. The resin composition for sealing semiconductor according to claim 16, further comprising:
a silane coupling agent in an amount of from 0.1% by mass to 0.6% by mass with respect to a total mass of the resin composition.

20. The resin composition for sealing semiconductor according to claim 12, wherein the triazole-based compound is 3-amino-5-mercapto-1,2,4-triazole.

* * * * *